United States Patent
Koide

(10) Patent No.: US 12,245,447 B2
(45) Date of Patent: Mar. 4, 2025

(54) TRANSISTOR SUBSTRATE AND MANUFACTURING METHOD

(71) Applicant: Japan Display Inc., Tokyo (JP)

(72) Inventor: Gen Koide, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 420 days.

(21) Appl. No.: 17/531,803

(22) Filed: Nov. 22, 2021

(65) Prior Publication Data

US 2022/0165971 A1 May 26, 2022

(30) Foreign Application Priority Data

Nov. 24, 2020 (JP) ................................ 2020-194461

(51) Int. Cl.
| | | |
|---|---|---|
| H10K 30/80 | (2023.01) | |
| H01L 27/146 | (2006.01) | |
| H10K 71/00 | (2023.01) | |

(52) U.S. Cl.
CPC ....... *H10K 30/80* (2023.02); *H01L 27/14612* (2013.01); *H01L 27/14643* (2013.01); *H10K 71/00* (2023.02)

(58) Field of Classification Search
None
See application file for complete search history.

(56) References Cited

U.S. PATENT DOCUMENTS

| | | |
|---|---|---|
| 2020/0380282 A1 | 12/2020 | Schwartz et al. |
| 2021/0391388 A1 | 12/2021 | Nakagawa et al. |
| 2022/0039697 A1 | 2/2022 | Higano et al. |

FOREIGN PATENT DOCUMENTS

JP  2020-511713 A  4/2020

OTHER PUBLICATIONS

Nakagawa et al, WO 2020075009, Sensor Device and Semiconductor Apparatus, Apr. 16, 2020 (Year: 2020).*
English-language translation of German Office Action issued May 28, 2024, in corresponding German Patent Application 10 2021 213 206.5, 5pp.
English-language translation of Japanese Office Action issued May 28, 2024, in corresponding Japanese Patent Application 2020-194461.

* cited by examiner

*Primary Examiner* — Alexander G Ghyka
(74) *Attorney, Agent, or Firm* — XSENSUS LLP

(57) ABSTRACT

According to one embodiment, a transistor substrate includes a substrate, a light source and a sensor element. The light source is mounted on the substrate. The sensor element is mounted on the substrate. The sensor element includes a pixel electrode, a switching element, a common electrode and an organic photo detector layer. The switching element is electrically connected to the pixel electrode. The common electrode is opposed to the pixel electrode. The organic photo detector layer is provided between the pixel electrode and the common electrode. The light source is provided in a same layer as the organic photo detector layer.

6 Claims, 9 Drawing Sheets

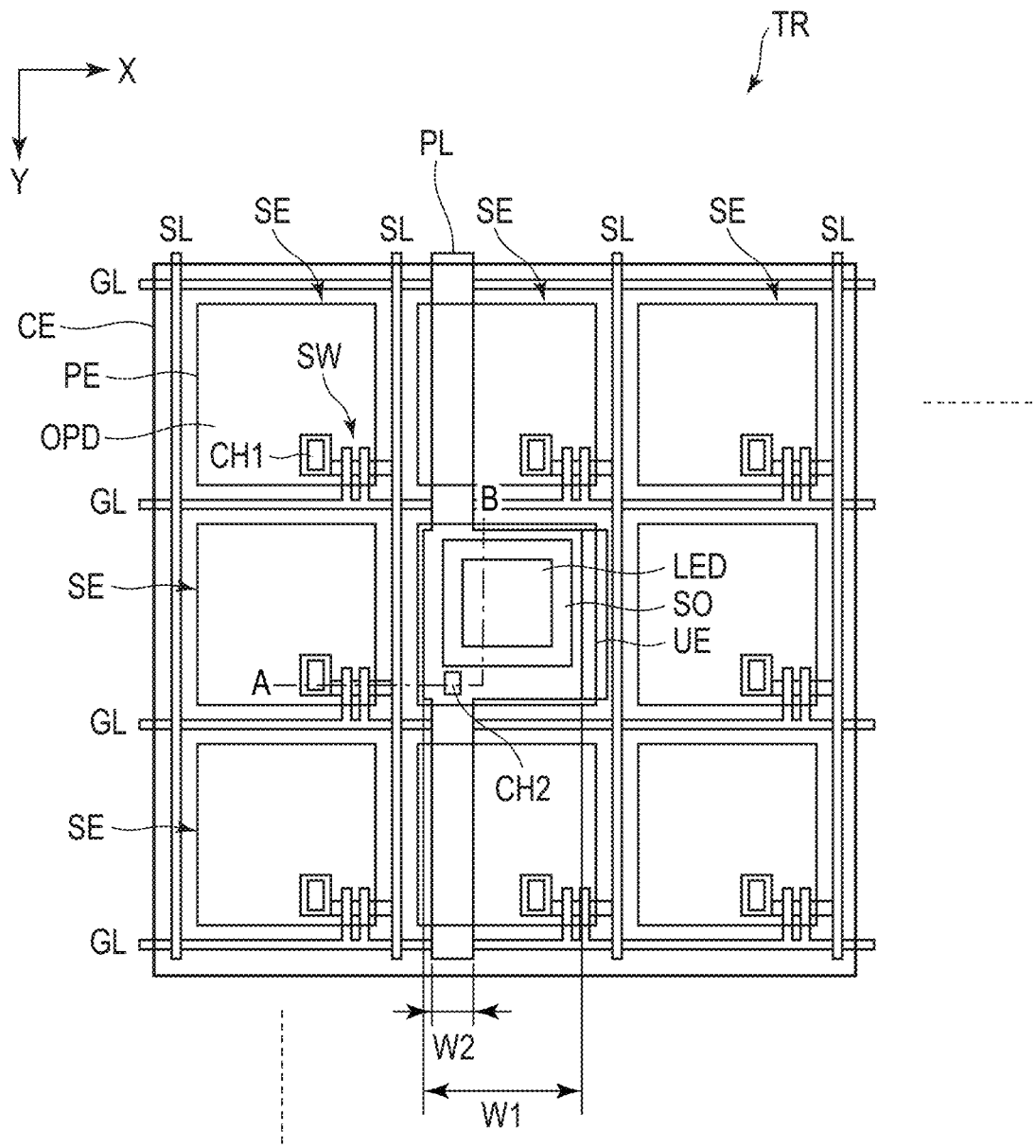
F I G. 1

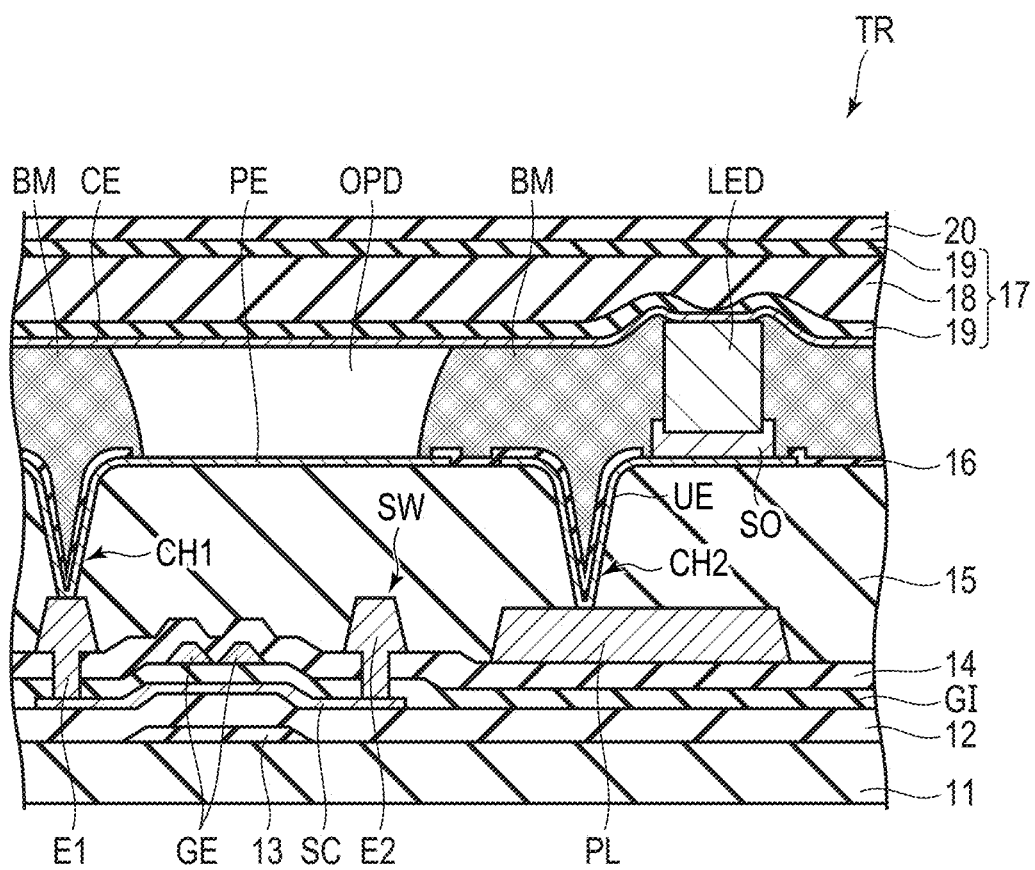
F I G. 6

TRANSISTOR SUBSTRATE AND MANUFACTURING METHOD

CROSS-REFERENCE TO RELATED APPLICATIONS

This application is based upon and claims the benefit of priority from Japanese Patent Application No. 2020-194461, filed Nov. 24, 2020, the entire contents of which are incorporated herein by reference.

FIELD

Embodiments described herein relate generally to a transistor substrate and a manufacturing method.

BACKGROUND

Recently, a sensor device using an organic photo detector (OPD) has become prevalent. As such a sensor device, a configuration in which a sensor element comprising an organic photo detector and a light source emitting light necessary for sensing data with the sensor element are provided on separate substrates is known.

BRIEF DESCRIPTION OF THE DRAWINGS

FIG. 1 is a plan view showing a configuration example of a transistor substrate according to one of embodiments.

FIG. 6 is a cross-sectional view showing another configuration example of the transistor substrate according to the embodiment.

DETAILED DESCRIPTION

Figure 2:
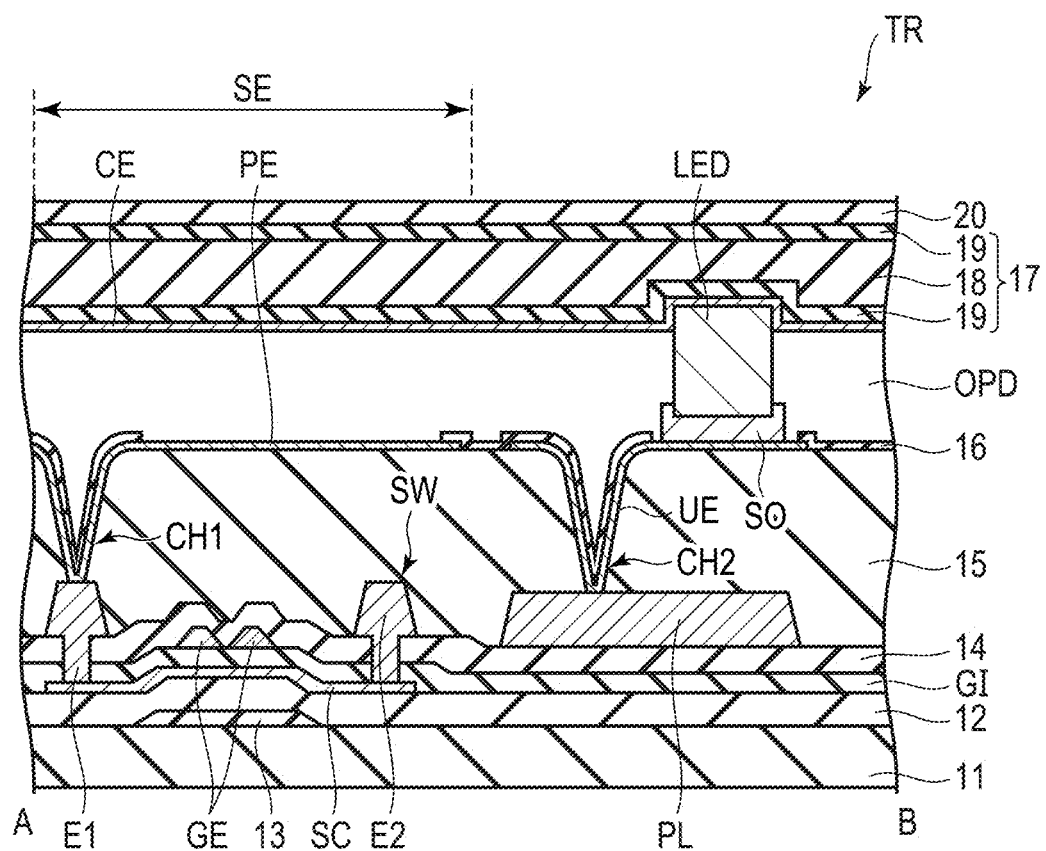
FIG. 2 is a cross-sectional view showing a cross section cut in line A-B shown in FIG. 1.

In general, according to one embodiment, a transistor substrate includes a substrate, a light source and a sensor element. The light source is mounted on the substrate. The sensor element is mounted on the substrate. The sensor element includes a pixel electrode, a switching element, a common electrode and an organic photo detector layer. The switching element is electrically connected to the pixel electrode. The common electrode is opposed to the pixel electrode. The organic photo detector layer is provided between the pixel electrode and the common electrode. The light source is provided in a same layer as the organic photo detector layer.

According to another embodiment, a method of manufacturing a transistor substrate includes a first process of mounting a light source on a substrate, and a second process of mounting on the substrate a sensor element including a pixel electrode, a switching element electrically connected to the pixel electrode, a common electrode opposed to the pixel electrode, and an organic photo detector layer provided between the pixel electrode and the common electrode, the organic photo detector layer being provided in a same layer as the light source.

Various embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the invention is schematically illustrated in the drawings, compared to the actual modes. However, the schematic illustration is merely an example, and adds no restrictions to the interpretation of the invention. Besides, in the specification and drawings, structural elements performing the functions that are the same as or similar to those described above in connection with preceding drawings are denoted by like reference numerals, detailed description thereof being omitted unless necessary.

FIG. 1 is a plan view showing a configuration example of a transistor substrate TR according to one of embodiments. The transistor substrate TR according to the present embodiment is used in, for example, a sensor device for measuring and detecting various biometric data such as finger vein, percutaneous oxygen saturation (SpO2), heart rate, blood pressure pulse wave, and fat percentage.

As shown in FIG. 1, the transistor substrate TR according to the present embodiment comprises sensor elements SE and a light source LED arrayed in a matrix along a first direction X and a second direction Y. The light source LED according to the present embodiment is a micro LED that is a self-luminous light emitting element. As the micro LED, a micro LED capable of emitting infrared rays or a green micro LED is used. For example, since hemoglobin in an artery has a property of easily absorbing green light, for example, a green micro LED is used for the light source LED mounted on the transistor substrate TR when the transistor substrate TR is used in a sensor device for measuring and detecting a heart rate.

As shown in FIG. 1, the transistor substrate TR comprises a plurality of scanning lines GL extending along the first direction X and spaced apart in the second direction Y, and a plurality of signal lines SL extending along the second direction Y and spaced apart in the first direction X. The sensor elements SE and the light source LED are arranged in pixel regions divided by the scanning lines GL and the signal lines SL. The sensor element SE comprises a switching element SW, a pixel electrode PE, a common electrode CE, and an organic photo detector layer OPD, which will be described later in detail together with descriptions of FIG. 2.

The switching element SW is constituted by, for example, a thin-film transistor (TFT) and is electrically connected to the scanning line GL and the signal line SL. The scanning line GL is electrically connected to the switching element SW in each of the sensor elements SE arranged in the first direction X. The signal line SL is electrically connected to the switching element SW in each of the sensor elements SE arranged in the second direction Y. Each of the pixel electrodes PE is connected to the switching element SW through a contact hole CH1. Each of the pixel electrodes PE is opposed to the common electrode CE. The organic photo detector layer OPD is sandwiched between each pixel electrode PE and the common electrode CE. When receiving light, the organic photo detector layer OPD generates pairs of holes and electrons. According to the pairs of holes and electrons generated from the organic photo detector layer OPD, a current flows, and an electric signal corresponding to the intensity of the electric current is read out through the signal line SL, thereby measuring and detecting various biological data.

The light source LED is electrically connected to a lower electrode UE by a connecting conductive member SO such as solder. The lower electrode UE is connected to the power line PL through a contact hole CH2. The power line PL extends along the second direction Y, similarly to the signal line SL. The power line PL has a predetermined line width W1 along the first direction X in the region where the light source LED is mounted, and has a line width W2 that is thinner than the above-mentioned predetermined line width W1 in other regions. According to this, in the region where the light source LED is mounted, it is possible to suppress occurrence of steps caused by the presence or absence of the power line PL, such as the presence of the power line PL in one place but the absence of the power line PL in the other place.

FIG. 1 illustrates a case in which one light source LED and eight sensor elements SE are arranged in a 3×3 pixel region, but the layout of the light source LED and the sensor elements SE is not limited thereto. For example, the number of arrangement of the light sources LEDs may be determined according to the required amount of light sources.

In addition, since the transistor substrate TR of the present embodiment is used in the sensor device for measuring and detecting various biometric data and does not need to display an image, as described above, the light source LED provided in the transistor substrate TR does not need to produce an analog gradation, and the light source LED may be directly connected to the power line PL (through the connecting conductive member SO and the lower electrode UE).

Furthermore, in the transistor substrate TR of the present embodiment, since the sensor element SE cannot be arranged in the pixel region in which the light source LED is arranged, sensing data cannot be acquired from the pixel region but, for example, a median value of the sensing data acquired by the eight sensor elements SE located in the surrounding may be calculated and this value may be used as the sensing data of the pixel region.

FIG. 2 is a cross-sectional view showing a cross-section of the transistor substrate TR cut in line A-B shown in FIG. 1.

The transistor substrate TR shown in FIG. 2 comprises an insulating substrate 11. As the insulating substrate 11, any material can be used as long as it can withstand the processing temperature during the TFT process, but mainly a glass substrate such as quartz or alkali-free glass or a resin substrate such as polyimide can be used. The resin substrate has flexibility and can constitute a sheet-like transistor substrate TR. Incidentally, not only polyimide, but the other resin material may be used as the resin substrate.

An undercoat layer 12 of a three-layer stacked structure is provided on the insulating substrate 11. Illustration of details is omitted in the figures, but the undercoat layer 12 includes a lowermost layer formed of silicon oxide (SiO2), a middle layer formed of silicon nitride (SiN), and an uppermost layer formed of silicon oxide (SiO2). The lowermost layer is provided to improve adhesion to the insulating substrate 11, which is the base. The middle layer is provided as a blocking film for moisture and impurities from the outside. The uppermost layer is provided as a blocking film to prevent hydrogen atoms contained in the middle layer from diffusing to the semiconductor layer SC side to be described later.

Incidentally, the undercoat layer 12 is not limited to this structure. The undercoat layer 12 may further include stacked layers or may have a single-layer structure or a two-layer structure. For example, when the insulating substrate 11 is a glass substrate, a silicon nitride film may be formed directly on the insulating substrate 11 since the silicon nitride film has a comparatively good adherence.

A light-shielding film 13 is arranged on the insulating substrate 11. The position of the light-shielding film 13 is made to correspond to a location where a TFT is to be formed later. The light-shielding film 13 may be formed of a material having light-shielding properties, such as a metal material or a black material. According to the light-shielding film 13, since entry of light to a back surface of the channel of the TFT can be suppressed, variation in the TFT properties resulting from the light that can be made incident from the insulating substrate 11 side can be suppressed. When the light-shielding film 13 is formed of a conductive material, a backdate effect can be assigned to the TFT by supplying a predetermined potential to the light-shielding film 13.

A TFT is formed on the undercoat layer 12. A polysilicon TFT using polysilicon for the semiconductor layer SC is used as an example of the TFT. However, the semiconductor layer SC is not limited to polysilicon, but may also be an oxide semiconductor or amorphous silicon. In the present embodiment, the semiconductor layer SC is formed using low temperature polysilicon. Either Nch TFT or Pch TFT may be used as the TFT. In addition, the Nch TFT and the Pch TFT may be formed simultaneously. A case in which an Nch TFT is used as the TFT will be described below.

The semiconductor layer SC of the Nch TFT includes a first region, a second region, a channel region between the first region and the second region, and a low-concentration impurity regions provided between the channel region and the first region and between the channel region and the second region, respectively. One of the first region and the second region functions as a source region, and the other functions as a drain region.

A gate insulating film GI is formed by using a silicon oxide film, and a gate electrode GE is formed of molybdenum tungsten (MoW). The gate electrode GE comprises a function of a storage capacitor electrode, which will be described later, in addition to a function of the gate electrode of the TFT. The top-gate TFT has been described as the example, but the TFT may be a bottom-gate TFT.

A passivation layer 14 is provided on the gate insulating film GI and the gate electrode GE. The passivation layer 14 is constituted by stacking, for example, a silicon nitride film and a silicon oxide film in order on the gate insulating film GI and the gate electrode GE.

The first electrode E1 and the second electrode E2 of the TFT are provided on the passivation layer 14. In addition, a power line PL is provided on the passivation layer 14. Each of the first electrode E1, the second electrode E2, and the routing line LL adopts a three-layer stacked structure (Ti-based/Al-based/Ti-based), and includes a lowermost layer formed of a metal material containing titanium (Ti) as a main component, such as Ti or an alloy containing Ti, an intermediate layer formed of a metal material containing aluminum (Al) as a main component, such as Al or an alloy containing Al, and an uppermost layer formed of a metal material containing Ti as a main component, such as Ti or an alloy containing Ti.

The first electrode E1 is connected to the first region of the semiconductor layer SC and the second electrode E2 is connected to the second region of the semiconductor layer SC. For example, when the first region of the semiconductor layer SC functions as the drain region, the first electrode E1 is the drain electrode, and the second electrode E2 is the source electrode. The first electrode E1, together with the passivation layer 14 and the gate electrode GE (storage capacitor electrode) of the TFT, forms a storage capacitor. A reference voltage is applied to the first electrode E1.

A planarization film 15 is provided on the passivation layer 14, the first electrode E1, the second electrode E2, and the power line PL. The planarization film 15 is removed and has openings (contact holes CH1 and CH2) in a region where the pixel electrode PE of the sensor element SE is in contact with the TFT and a region where the lower electrode UE of the light source LED is in contact with the power line PL. An organic insulating material such as a photosensitive acrylic is frequently used as the planarizing film 15. This is superior to inorganic insulating materials formed by CVD or the like in terms of coverage of wiring steps and surface flatness.

In the sensor element SE, the pixel electrode PE is provided on the planarization film 15. The pixel electrode PE is connected to the first electrode E1 through the contact hole CH1 formed in the planarization film 15. In the light source LED, the lower electrode UE is provided on the planarization film 15. The lower electrode UE is connected to the power line PL through the contact hole CH2 formed in the planarization film 15.

The planarization film 15, the pixel electrode PE, and the lower electrode UE are covered with an inorganic insulating film 16. The inorganic insulating film 16 is removed and has openings in a region where the organic photo detector layer OPD is in contact with the pixel electrode PE and a region where the connection conductive member SO is in contact with the lower electrode UE. The inorganic insulating film 16 is formed of, for example, a silicon nitride film.

The pixel electrode PE and the inorganic insulating film 16 are covered with the organic photo detector layer OPD composed of a plurality of layers. In the sensor element SE, the pixel electrode PE is in contact with the organic photo detector layer OPD at the opening formed in the inorganic insulating film 16. In addition, the connection conductive member SO is provided on the lower electrode UE and in the opening formed in the inorganic insulating film 16. The light source LED is provided on the connection conductive member SO. Details will be described later, but the light source LED is desirably a type of light source that emits light only in the directly upward direction and does not emit light in the horizontal direction.

Since the organic photo detector layer OPD cannot withstand a high temperature process, it is desirable that the layer is formed after the light source LED is mounted. At this time, the organic photo detector layer OPD exposes the upper surface (emission surface) of the light source LED.

One common electrode CE is provided on the organic photo detector layer OPD and the light source LED to cover the organic photo detector layer OPD and the light source LED. The common electrode CE is provided as an electrode opposite to the pixel electrode PE with respect to the sensor element SE. The common electrode CE is provided as an upper electrode opposite to the lower electrode UE with respect to the light source LED.

The power line for supplying the power to the common electrode CE is provided in, for example, the same layer as the first electrode E1, the second electrode E2, and the power line PL, which is not illustrated in FIG. 2. A plurality of power lines may be provided for each pixel region or only one power line may be provided to be commonly used in all pixel regions. However, when only one power line is provided to be commonly used in all pixel regions, the applied voltage becomes smaller in the pixel region farther from the power line due to a voltage drop based on the resistance of the common electrode CE. For this reason, it is desirable that the power line for supplying the power to the common electrode CE is provided in each pixel region and, in this case, the reduction in resistance can be attempted as compared with the case where the power line is shared in all pixel regions.

The common electrode CE needs to be formed as a transparent electrode in order to take out the emitted light from the light source LED. The common electrode CE is formed using, for example, ITO as a transparent conductive material.

A sealing layer 17 is provided on the common electrode CE. The sealing layer 17 is provided to prevent moisture from entering the organic photo detector layer OPD from the outside. The sealing layer 17 has a stacked structure of an organic insulating film 18 and a pair of inorganic insulating films 19 that sandwich the organic insulating film. A resin layer 20 that functions as a protective film is provided on the sealing layer 17.

The above-described transistor substrate TR can be manufactured, for example, by the following manufacturing method. Only main processes of the manufacturing method of the transistor substrate TR will be described here.

First, the light-shielding film 13 is formed on the insulating substrate 11 in the pixel region where the sensor element SE is arranged. After that, the undercoat layer 12 is formed to cover the insulating substrate 11 and the light-shielding film 13. Then, a TFT is formed on the undercoat layer 12, in the pixel region where the sensor element SE is arranged. This TFT and the light-shielding film 13 are overlapped in planar view. In addition, the power line PL is formed on the same layer as the above-described TFT, in the pixel region where the light source LED is arranged. Then, the planarization film 15 is formed to cover the TFT and the power line PL.

In the planarization film 15, the contact hole CH1 is formed in the pixel region where the sensor element SE is arranged and where the TFT and the pixel electrode PE are in contact with each other. In addition, in the planarization film 15, the contact hole CH2 is formed in the pixel region where the light source LED is arranged and where the power line PL and the lower electrode UE are in contact with each other. After that, each of the pixel electrode PE and the lower electrode UE is formed on the planarization film 15. The pixel electrode PE is connected to the TFT through the contact hole CH1, and the lower electrode UE is connected to the power line PL through the contact hole CH2.

Subsequently, the inorganic insulating film 16 is formed to cover the pixel electrode PE, the lower electrode UE, and the planarization film 15. The opening is provided in the pixel region where the sensor element SE is arranged and where the pixel electrode PE and the organic photo detector layer OPD are in contact with each other, in the organic insulating film 16. In addition, an aperture is formed in the pixel region where the light source LED is arranged, which is the mounting region of the light source LED, in the inorganic insulating film 16. The light source LED is mounted via the connection conductive member SO such as solder, in the mounting region of the light source LED. The light source LED is electrically connected to the lower electrode UE and the power line PL via the connection conductive member SO.

After the light source LED is mounted, the organic photo detector layer OPD is formed on the pixel electrode PE and the inorganic insulating film 16. At this time, the organic photo detector layer OPD is formed to expose the emission surface of the light source LED. Then, the common electrode CE is formed on the organic photo detector layer OPD and the light source LED. After that, the sealing film 17 and the protective film 20 are formed on the common electrode CE, and the transistor substrate TR is thereby manufactured.

An example of the stacked structure of the organic photo detector layer OPD composed of a plurality of layers will be described here.

Figure 3:
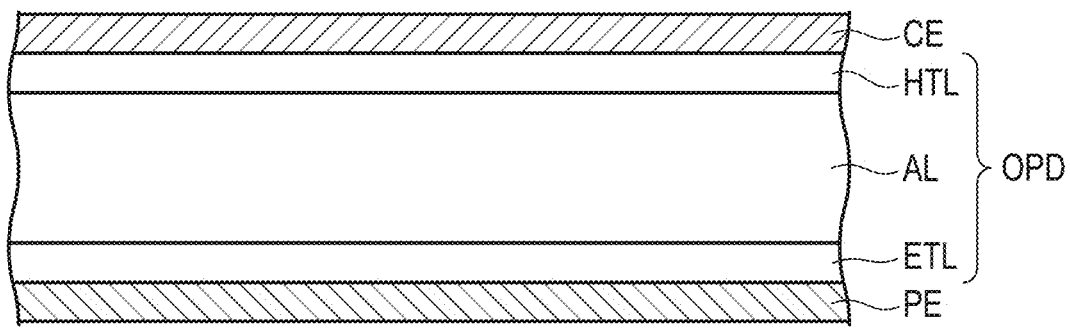
FIG. 3 is a view illustrating a stacked structure of an organic photo detector layer according to the embodiment.

FIG. 3 is a view illustrating an example of the stacked structure of the organic photo detector layer OPD. The stacking structure shown in FIG. 3 is a stacked structure in a case where the pixel electrode PE functions as a cathode and the common electrode CE functions as an anode in the sensor element SE. In this case, an electron transport layer ETL, an active layer AL, and a hole transport layer HTL are stacked in this order, in the organic photo detector layer OPD, as shown in FIG. 3. The electron transport layer ETL and the pixel electrode PE are in contact with each other in an opening formed in the inorganic insulating film 16. When receiving light, the active layer AL generates pairs of electrons and holes by charge separation. The generated electrons are transported through the electron transport layer ETL. The generated holes are transported through the hole transport layer HTL.

Figure 4:
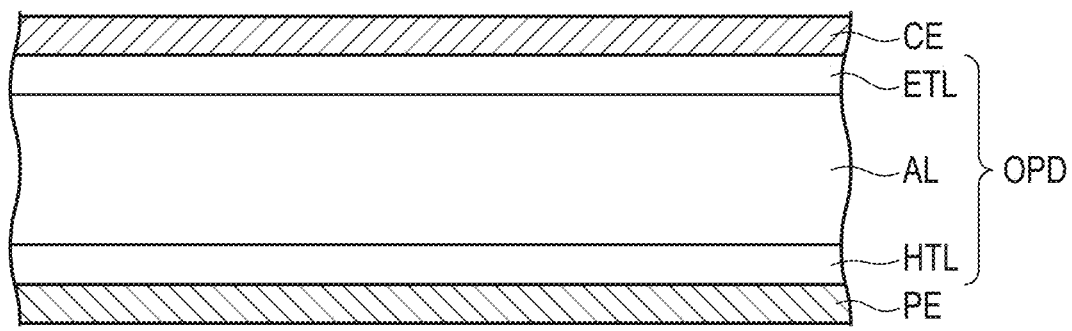
FIG. 4 is a view illustrating another stacked structure of the organic photo detector layer according to the embodiment.

FIG. 4 is a view illustrating another example of the stacked structure of the organic photo detector layer OPD. The stacked structure of FIG. 4 is a stacked structure in a case where the pixel electrode PE functions as an anode and the common electrode CE functions as a cathode in the sensor element SE. In this case, the hole transport layer HTL, the active layer AL, and the electron transport layer ETL are stacked in this order, in the organic photo detector layer OPD, as shown in FIG. 4. The hole transport layer HTL and the pixel electrode PE are in contact with each other at the opening formed in the inorganic insulating film 16. When receiving light, the active layer AL generates pairs of electrons and holes by charge separation. The generated electrons are transported through the electron transport layer ETL. The generated holes are transported through the hole transport layer HTL.

In the sensor element SE, whether the pixel electrode PE and the common electrode CE function as anodes or cathodes can be selected appropriately depending on what voltage is applied to the common electrode CE with respect to the reference voltage applied to the pixel electrode PE via the first electrode E1.

As described above, the transistor substrate TR of the embodiment comprises on the same substrate the sensor element SE capable of generating a current by receiving light and of measuring and detecting various types of biometric data by reading an electric signal corresponding to the intensity of the current, and the light source LED that emits light necessary for sensing of the sensor element SE. According to this, the organic photo detector layer OPD constituting the sensor element SE can also serve as a planarization film necessary for mounting the light source LED.

In addition, since the organic photo detector layer OPD also serves as a planarization film necessary for mounting the light source LED, commonality of the electrode provided on the upper surface of the organic photo detector layer OPD and the electrode provided on the upper surface of the light source LED can be achieved. According to this, since commonality of various types of constituent elements can be achieved, the costs of the transistor substrate TR can be reduced and the costs of the sensor device using the organic photosensitive element can be further reduced.

The sensor element SE needs to receive light reflected by the detection target to measure and detect various types of biometric data and, even if the light from the light source LED directly enters, the biometric data of the detection target cannot be measured and detected. In addition, if the light from the light source LED directly enters the sensor element SE, an unintended current may flow into the transistor substrate TR, which may cause the transistor substrate TR to be broken. For this reason, the transistor substrate TR of the present embodiment is provided with the light source LED of the type that applies light only in the directly upward direction, and insulates part between the sensor element SE and the light source LED with the inorganic insulating film 16, but the configuration of the transistor substrate TR is not limited thereto.

Figure 5:
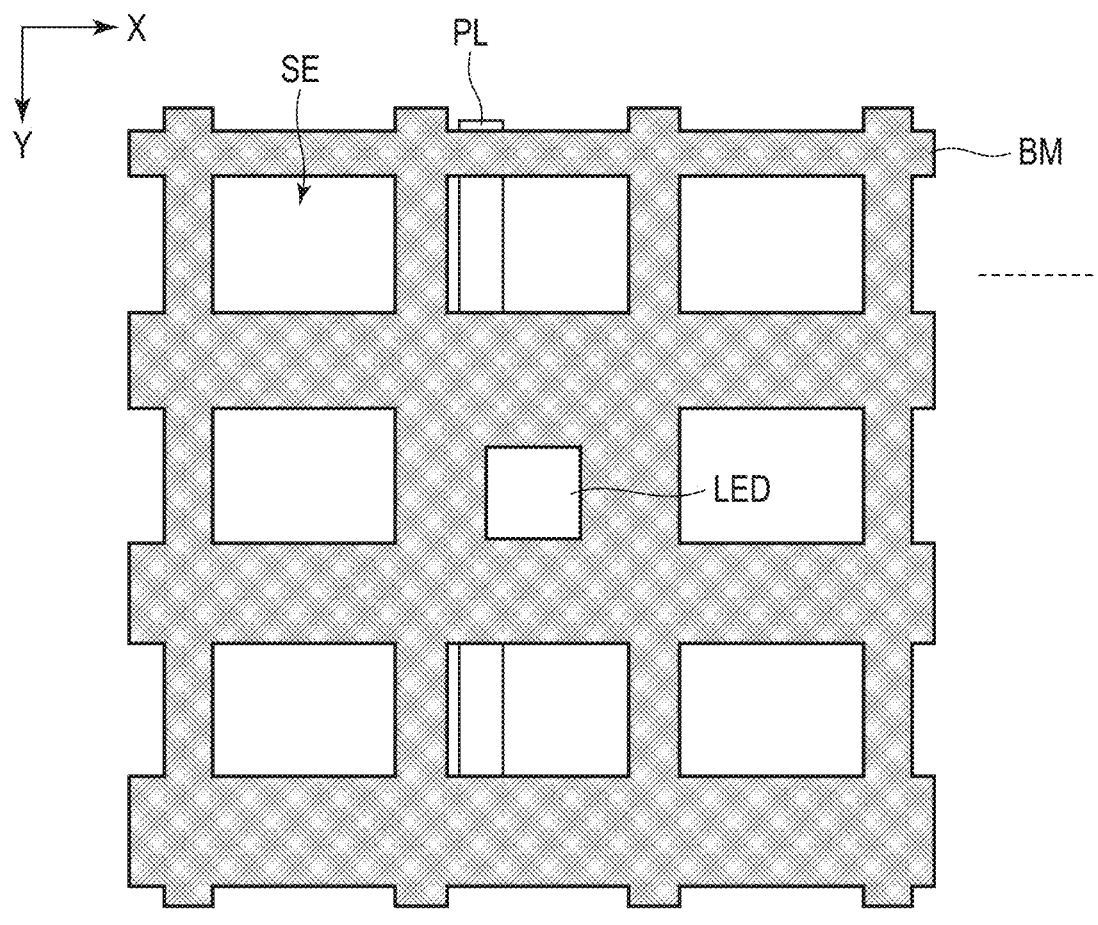
FIG. 5 is a plan view showing another configuration example of the transistor substrate according to the embodiment.

For example, as shown in FIG. 5 and FIG. 6, a direct incidence of light from the light source LED to the sensor element SE may be suppressed and insulation between the sensor element SE and the light source LED may be maintained by providing a black material BM on a surface other than the light receiving surface of the sensor element SE and the emission surface of the light source LED. In this configuration, as shown in FIG. 5 and FIG. 6, the black material BM is provided in a grating pattern to cover the inorganic insulating film 16, and the contact holes CH1 and CH2 over all pixel regions.

Figure 7:
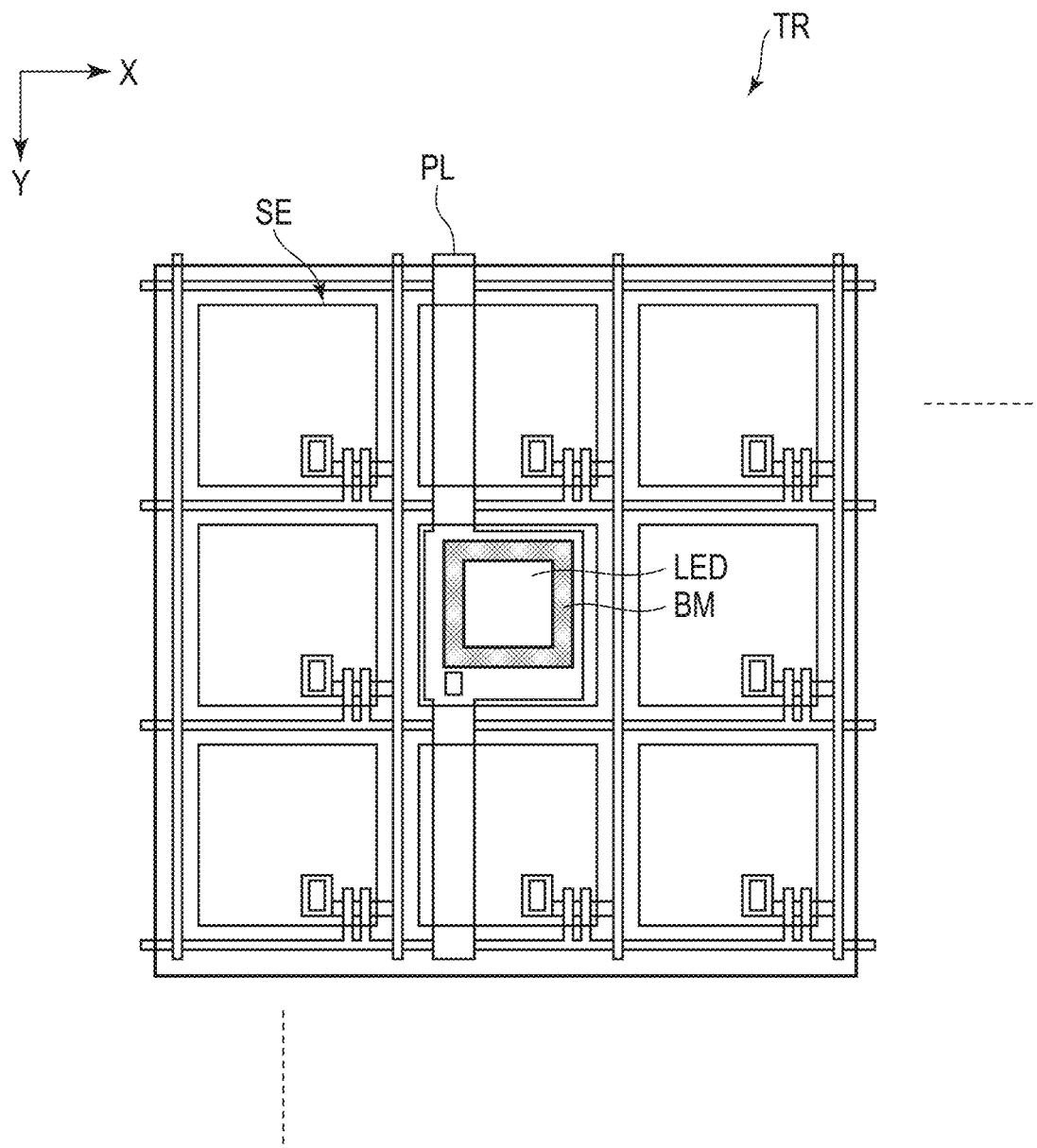
FIG. 7 is a plan view showing another configuration example of the transistor substrate according to the embodiment.
Figure 8:
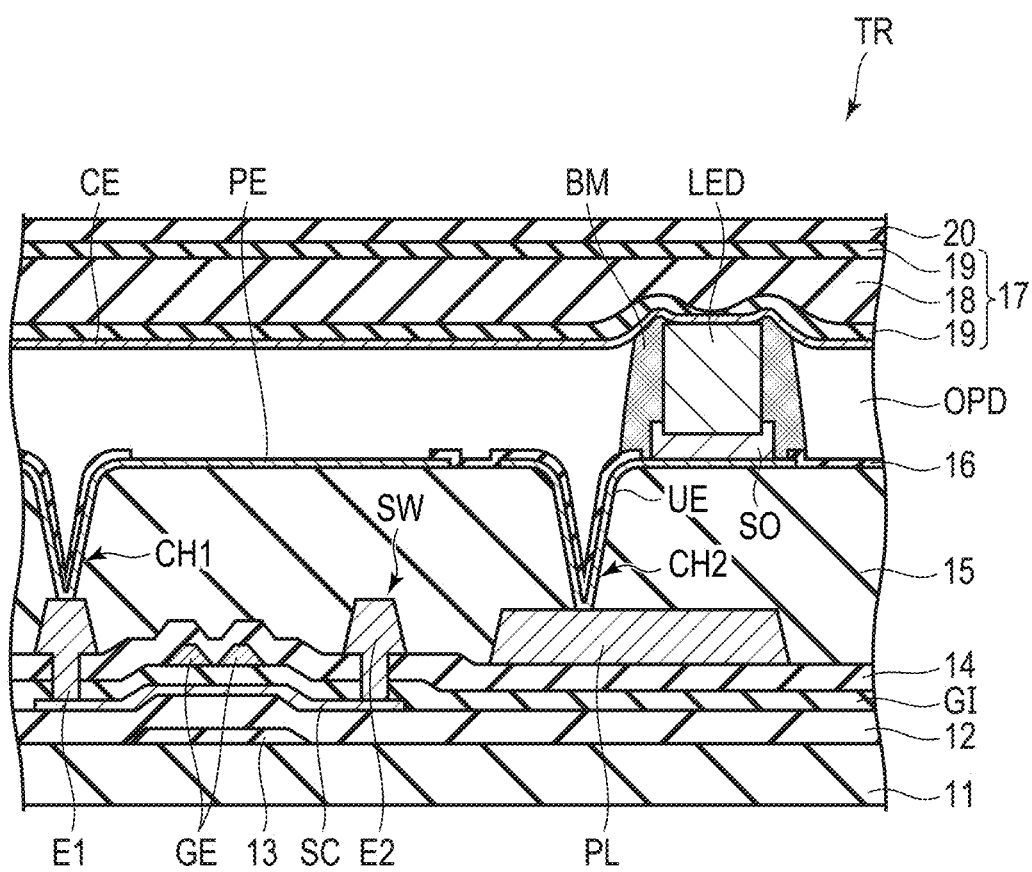
FIG. 8 is a cross-sectional view showing yet another configuration example of the transistor substrate according to the embodiment.

Alternatively, as shown in FIG. 7 and FIG. 8, direct incidence of the light from the light source LED to the sensor element SE may be suppressed and the insulation between the sensor element SE and the light source LED may be maintained by providing the black material BM only around the light source LED. In this configuration, as shown in FIG. 7 and FIG. 8, the black material BM is provided to cover the inorganic insulating film 16 in the pixel region in which the light source LED is arranged.

Even in the configuration shown in FIG. 5 to FIG. 8, the transistor substrate TR comprises the sensor element SE and the light source LED on the same substrate. In addition, the organic photo detector layer OPD also serves as the planarization film necessary for mounting the light source LED, and the feature that the commonality of the electrode provided on the upper surface of the organic photo detector layer OPD and the electrode provided on the upper surface of the light source LED can be achieved remains unchanged. For this reason, even in the configuration shown in FIG. 5 to FIG. 8, reduction in the costs of the transistor substrate TR can be attempted.

Figure 9:
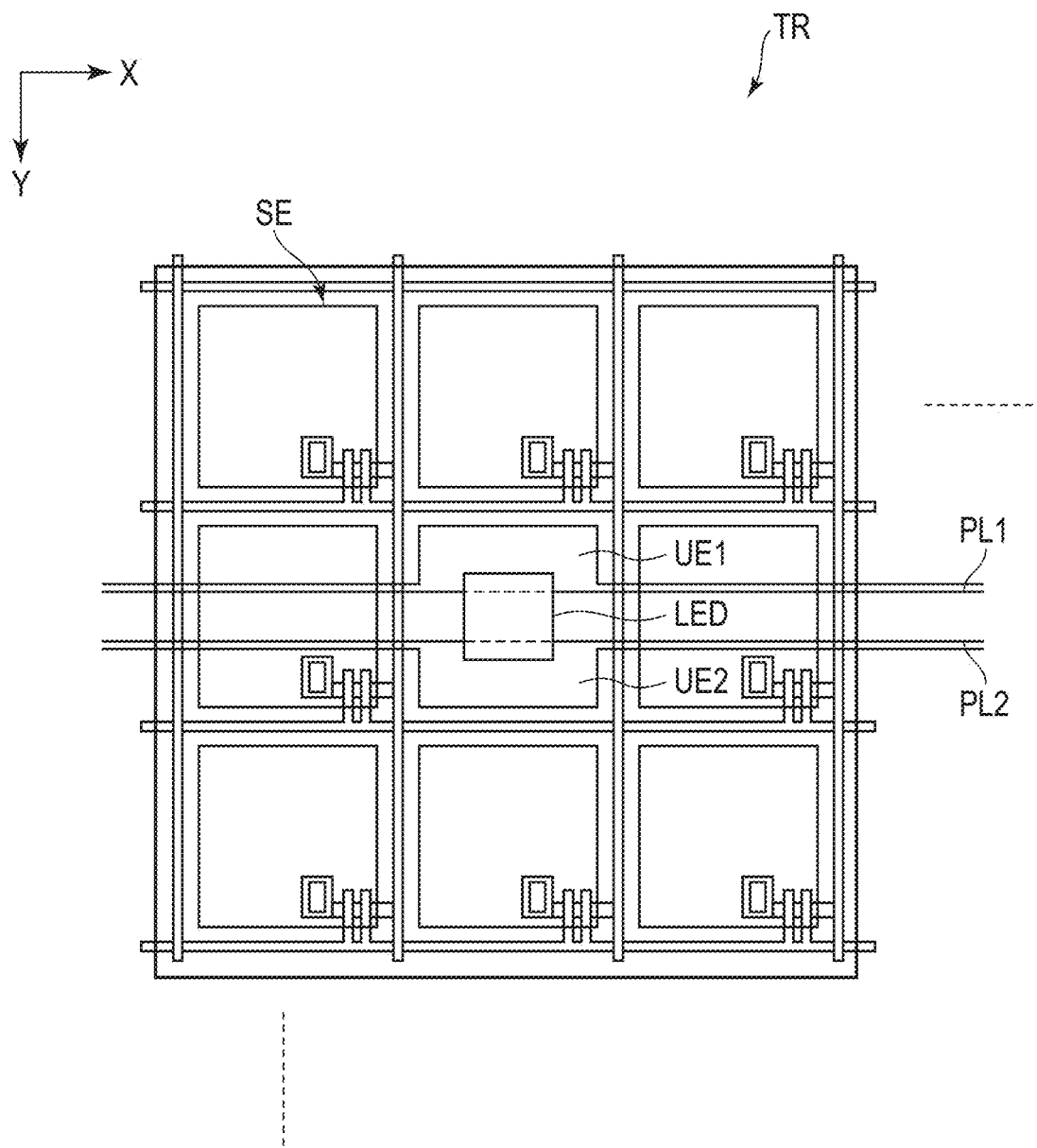
FIG. 9 is a plan view showing another configuration example of the transistor substrate according to the embodiment.

In the above-described present embodiment, it is assumed that the light source LED comprises the electrodes (i.e., the lower electrode UE and the common electrode CE) to which the power supply voltage is applied on the upper surface and the lower surface, but a so-called flip-chip type light source LED comprising two electrodes to which the power supply voltage is applied, on the lower surface, may be used as the light source LED. FIG. 9 is a plan view showing a configuration in a case where a flip-chip type light source LED comprises two electrodes UE1 and UE2 to which the power supply voltage is applied, on the lower surface.

In this case, as shown in FIG. 9, the light source LED comprises two electrodes UE1 and UE2 on the lower surface, and these two lower electrodes UE1 and UE2 are connected to two power lines PL1 and PL2 extending in the first direction X along the scanning line GL, respectively. These are connected to the flip-chip type light source LED and, for example, the power line PL1 is an anode power line or a cathode power line, and the power line PL2 is a cathode power line or an anode power line. Even in this configuration, the transistor substrate TR comprises the sensor element SE and the light source LED on the same substrate. In addition, since the feature that the organic photo detector layer OPD also serves as the planarization film necessary for mounting the light source LED is not changed, reduction in the costs of the transistor substrate TR can be attempted.

Figure 10:
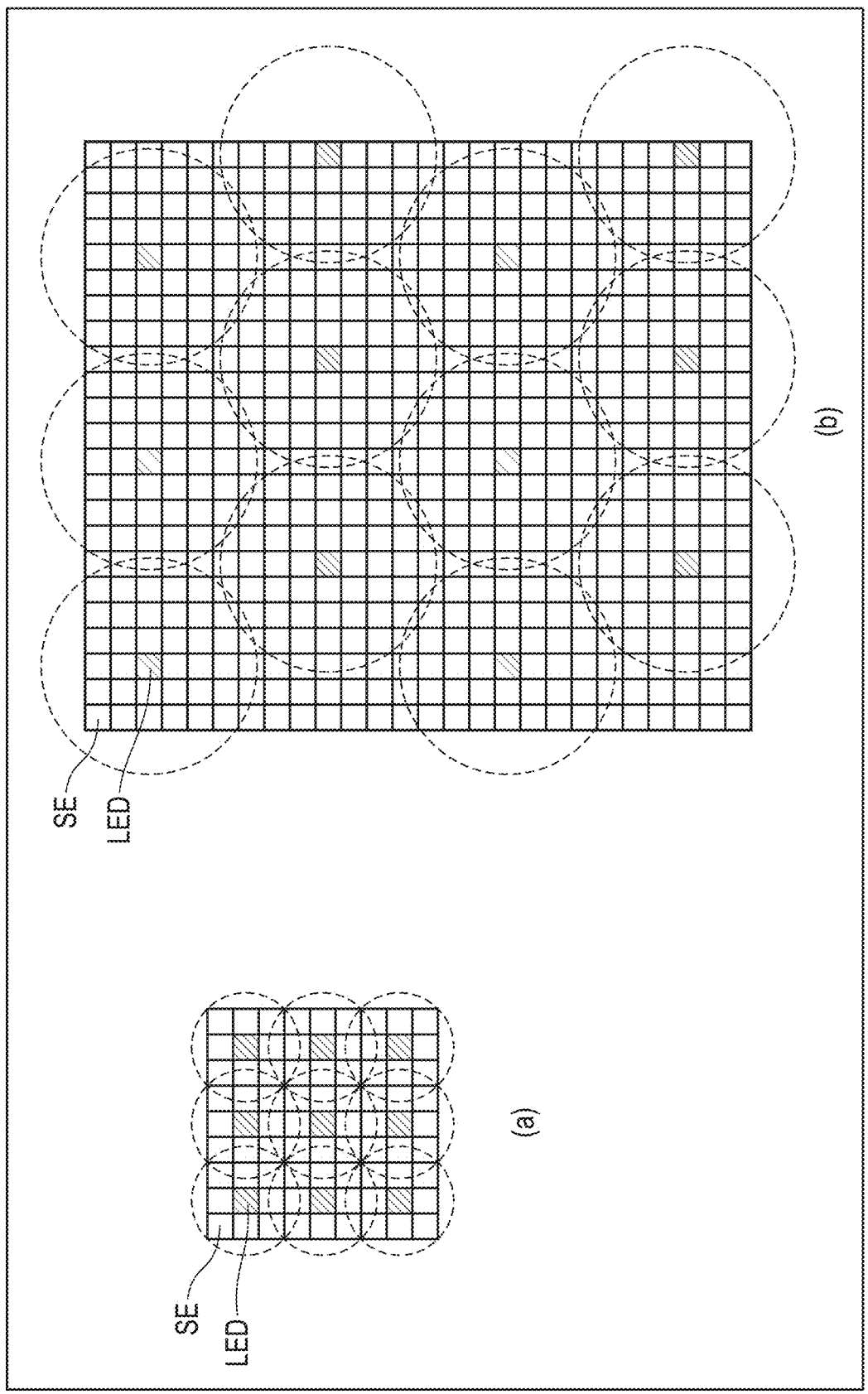
FIG. 10 is a plan view showing an example of arrangement layout of light sources arranged on the transistor substrate according to the embodiment.

FIG. 10 is a plan view showing an example of arrangement layout of a large number of light sources LED provided on the transistor substrate TR.

FIG. 10(a) shows an arrangement layout in which a number of light sources LED are arranged square. In FIG. 10(a), it is assumed that one light source LED is arranged in a 3×3 pixel region. The arrangement layout shown in FIG. 10(a) is an arrangement layout which is mainly effective in a case where the required amount of light sources is high and the number of arranged light sources LED is large. In contrast, FIG. 10(b) shows an arrangement layout in which a large number of light sources LED are arranged in a hexagonal arrangement (staggered arrangement). The arrangement layout shown in FIG. 10(b) is an arrangement layout which is mainly effective in a case where the required amount of the light sources is low and the number of arranged light sources LED is small. In the arrangement layout shown in FIG. 10(b), it is desirable to adopt a structure in which the shape formed by connecting the pixels where the light sources LED are arranged is close to a regular triangle and is close to a close-packed structure. However, the pitch in the first direction X and the pitch in the second direction Y in the pixels where the light sources LED are arranged may not be equal to each other.

Figure 11:
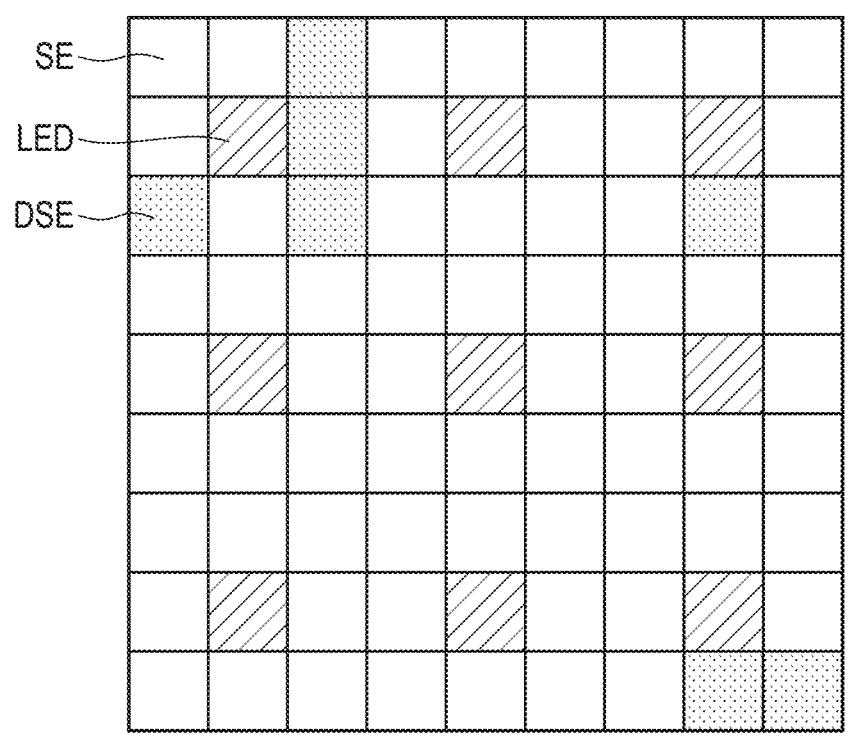
FIG. 11 is a view illustrating dummy sensor elements arranged on the transistor substrate according to the embodiment.

FIG. 11 is a view illustrating a dummy sensor element DSE provided on the transistor substrate TR. The dummy sensor element DSE indicates a sensor element which is arranged in a part of the pixel region where the sensor element SE is arranged, and which does not function as the sensor element SE. The dummy sensor element DSE is formed by, for example, arranging a black material BM instead of the organic photo detector layer OPD only in the pixel region. Alternatively, the dummy sensor element DSE is formed by not electrically connecting the switching element SW with the pixel electrode PE only in the pixel region.

By forming the dummy sensor element DSE, the detection intensity in the region where the dummy sensor element DSE is formed and the region where the dummy sensor element DSE is not formed can be made stronger or weaker. For example, as shown in FIG. 11, when a 3×3 pixel region is used as one detection region, the detection intensity of the detection region where the dummy sensor element DSE is formed can be made relatively lower than that of the detection region where the dummy sensor element DSE is not formed.

According to the embodiment described above, the transistor substrate and the manufacturing method thereof capable of reducing the costs of the sensor device using an organic photo detector can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transistor substrate comprising:
    a substrate;
    a light source mounted on the substrate; and
    a sensor element mounted on the substrate,
    the sensor element including a pixel electrode, a switching element electrically connected to the pixel electrode, a common electrode opposed to the pixel electrode, and an organic photo detector layer provided between the pixel electrode and the common electrode,
    the light source including a micro LED which a lower surface of the micro LED is in contact with a connection conductive member, and a upper surface of the micro LED is in contact with the common electrode,
    the micro LED surrounded by a black material provided in a same layer as the micro LED, and
    the connection conductive member connected to a power line via a lower electrode in the same layer as the pixel electrode.

2. The transistor substrate of claim 1, wherein
    the switching element is electrically connected to a scanning line extending in a first direction and a signal line extending in a second direction intersecting the first direction, and
    the light source and the sensor element are arranged in pixel regions partitioned by the scanning line and the signal line.

3. The transistor substrate of claim 2,
    wherein the power line is electrically connected to the common electrode and provided in each of the pixel regions.

4. The transistor substrate of claim 1,
    wherein
    the power line has a first line width in a region overlapped on the lower electrode in planar view and a second line width thinner than the first line width in a region which is not overlapped on the lower electrode in planar view.

5. The transistor substrate of claim 1, wherein
    when the pixel electrode functions as a cathode and the common electrode functions as an anode in the sensor element, the organic photo detector layer has a stacked structure in which an electron-transport layer, an active layer, and a hole-transport layer are stacked in order.

6. The transistor substrate of claim 1, wherein
    when the pixel electrode functions as an anode and the common electrode functions as a cathode in the sensor element, the organic photo detector layer has a stacked structure in which a hole-transport layer, an active layer, and an electron-transport layer are stacked in order.

* * * * *